United States Patent [19]

Khadder et al.

[11] 4,373,253
[45] Feb. 15, 1983

[54] INTEGRATED CMOS PROCESS WITH JFET

[75] Inventors: Wadie N. Khadder, Sunnyvale; Jia-Tarng Wang, San Jose; James E. Solomon, Cupertino, all of Calif.

[73] Assignee: National Semiconductor Corporation, Santa Clara, Calif.

[21] Appl. No.: 253,470

[22] Filed: Apr. 13, 1981

[51] Int. Cl.³ ............... H01L 27/04; H01L 21/263; H01L 21/22
[52] U.S. Cl. .................... 29/576 B; 29/571; 29/577 C; 148/1.5; 148/187; 357/44; 357/91
[58] Field of Search ............ 29/576 B, 571, 577 C; 148/1.5, 187; 357/44, 22, 91

[56] References Cited

U.S. PATENT DOCUMENTS

| 3,697,827 | 10/1972 | Simon | 317/235 |
|---|---|---|---|
| 3,983,620 | 10/1976 | Spadea | 29/571 |
| 4,176,368 | 11/1979 | Compton | 357/22 |
| 4,212,025 | 7/1980 | Hirasawa et al. | 357/42 |
| 4,217,149 | 8/1980 | Sawazaki | 148/1.5 |
| 4,233,615 | 11/1980 | Takemoto et al. | 357/22 |
| 4,244,752 | 1/1981 | Henderson et al. | 148/1.5 |
| 4,280,272 | 7/1981 | Egawa et al. | 29/571 |

Primary Examiner—Upendra Roy
Attorney, Agent, or Firm—Gail W. Woodward; Paul J. Winters; Neil B. Schulte

[57] ABSTRACT

A process for fabricating JFET devices into a conventional CMOS monolithic IC. The combination of devices provides linear circuit operation with low noise characteristics.

8 Claims, 12 Drawing Figures

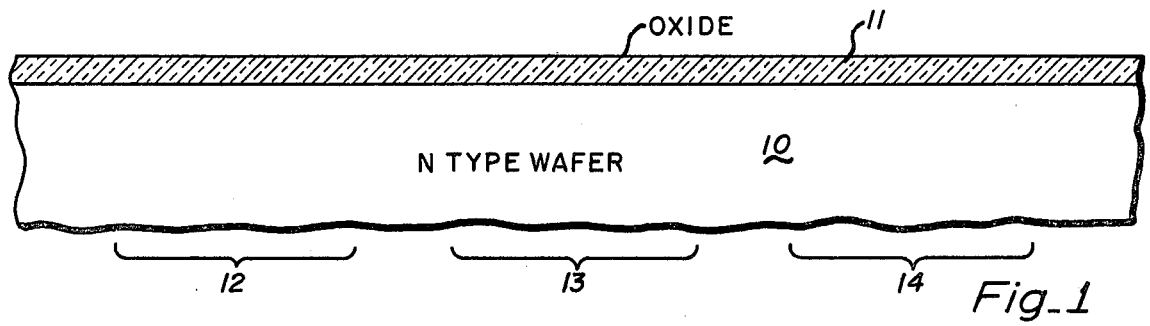
Fig_1
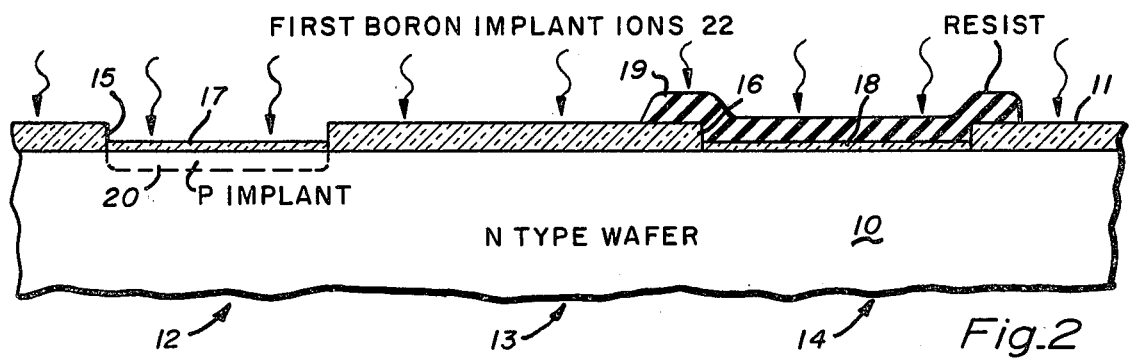
Fig_2
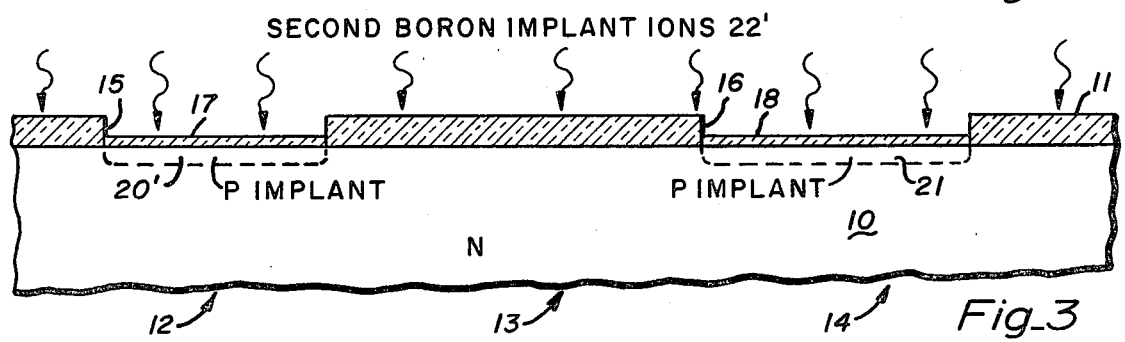
Fig_3
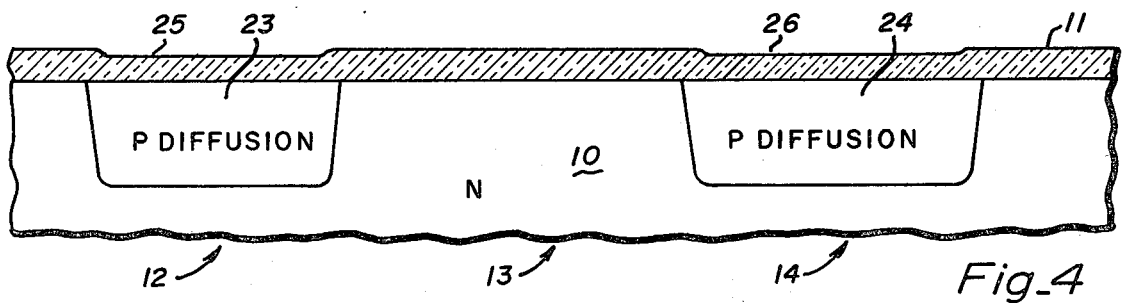
Fig_4
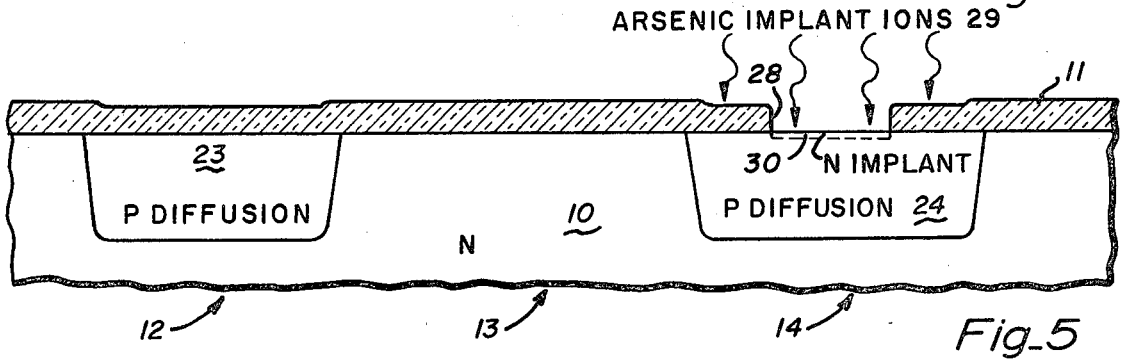
Fig_5

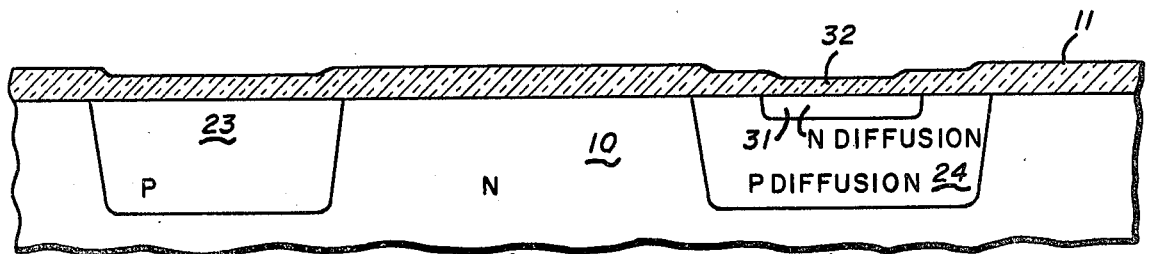
Fig_6
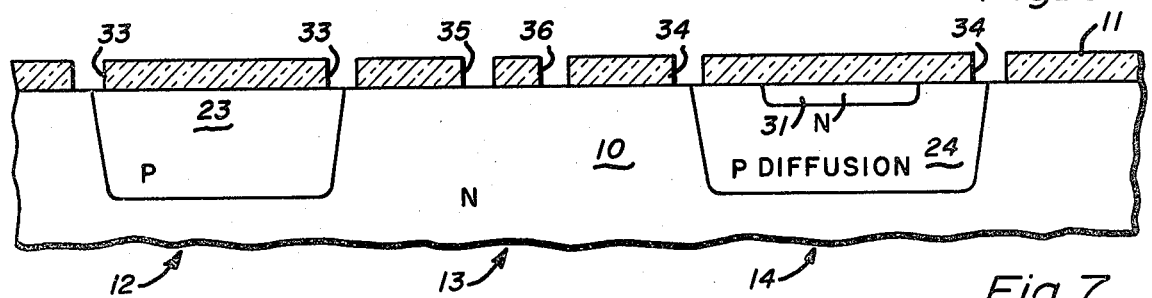
Fig_7
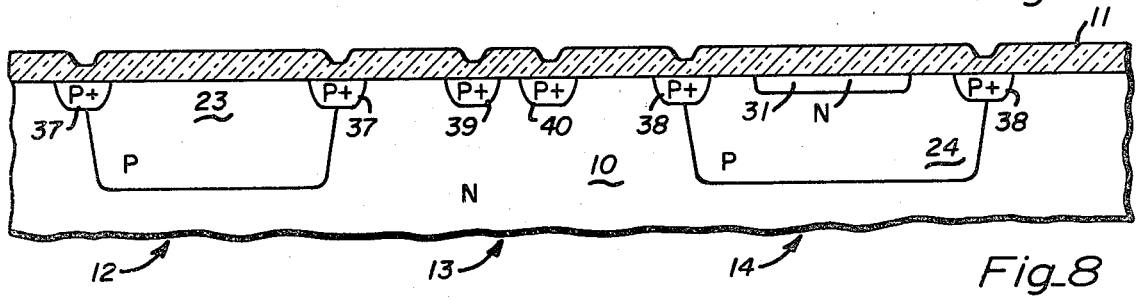
Fig_8
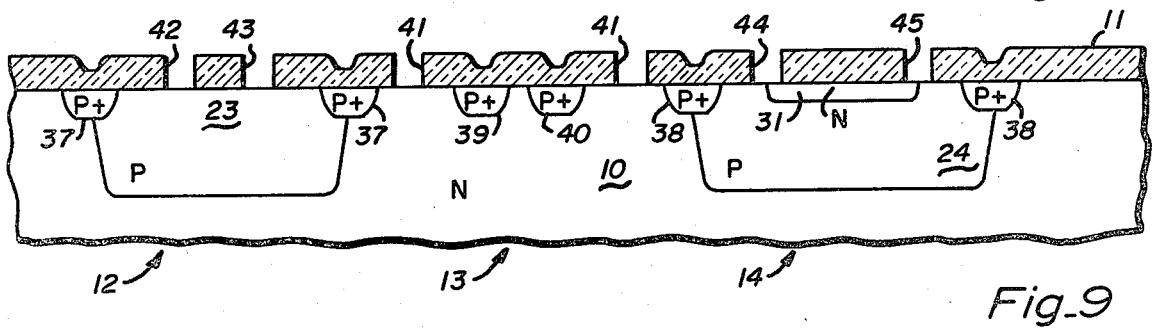
Fig_9
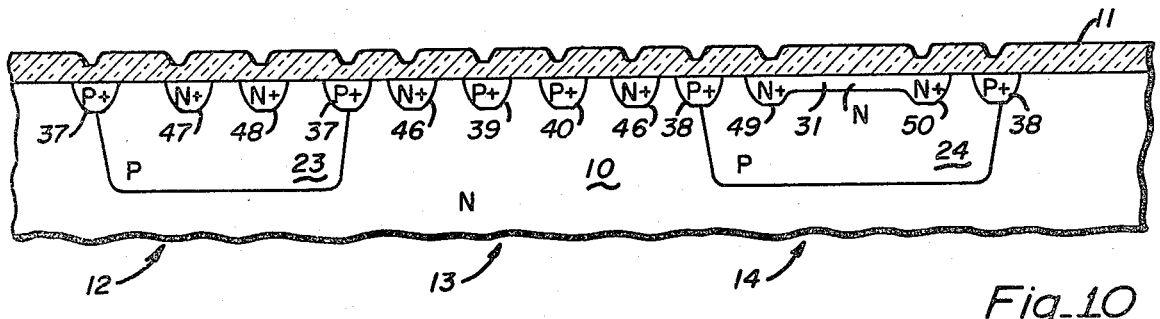
Fig_10

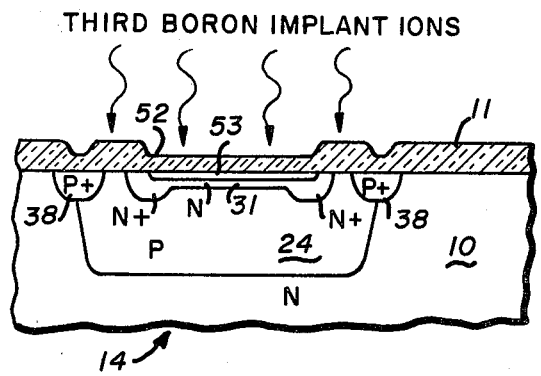
Fig_11
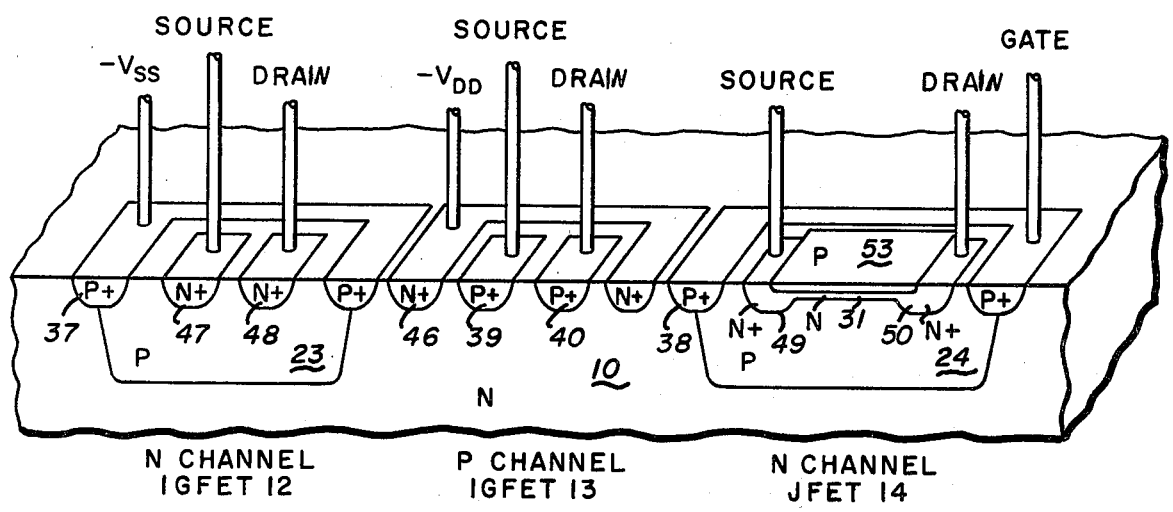
Fig_12

INTEGRATED CMOS PROCESS WITH JFET

BACKGROUND OF THE INVENTION

Complementary Metal Oxide Semiconductor (CMOS) Integrated Circuit (IC) devices are well known in the art and many monolithic structure forms are commercially available. Because such devices can employ circuits that consume very little power, their popularity has grown substantially over the years. However, most applications are digital in nature because in linear operation CMOS circuits are relatively noisy. Accordingly, most linear circuits employ bipolar active devices. For many years Junction Field Effect Transisitor (JFET) devices have been employed in linear IC's to provide circuits having superior characteristics. For example JFET input stages coupled to conventional Bipolar Junction Transistor (BJT) amplifiers provide very high input impedance, low noise operational amplifier (op amp) performance. Such devices have become very popular with equipment designers. In recent years, there has been great interest in building CMOS-based linear circuits because they are lower in cost than bipolar circuits, and because they offer mixed linear and digital functions on the same IC. A key requirement for such CMOS-linear IC's is that they include low noise amplifiers. This disclosure describes an IC structure that solves this low noise amplifier problems.

For CMOS fabrication reference can be made to the Gregorio Spadea U.S. Pat. No. 3,983,620 which was issued Oct. 5, 1976, to the assignee of the present invention. Reference is also made to James B. Compton U.S. Pat. No. 4,176,368 which was issued Nov. 27, 1979, to the assignee of the present invention. Here an improved P-Channel JFET is described for use in conventional bipolar monolithic IC structures. The teaching in the above two patents is incorporated herein by reference.

SUMMARY OF THE INVENTION

It is an object of the invention to provide a CMOS process that includes the fabrication of JFET devices.

It is a further object of the invention to create low noise JFET devices for integration into CMOS IC structures.

It is a still further object of the invention to provide a process in which JFET devices are fabricated along with CMOS devices and in which the JFET devices can be separately optimized.

These and other objects are achieved in a process wherein ion implantation is employed to precisely control the doping in the p-well regions that will ultimately contain N-channel insulated gate field effect transistor (IGFET) structures. JFET p-wells are simultaneously created and optimized for the devices desired. The JFET channels are created by ion implanting slow diffusing impurities and the channel regions are overcoated with a conventional top cap that acts as a top gate and simultaneously creates a subsurface channel. The resulting structure has the desired JFET properties and, when suitable process controls are employed, can have a very low noise figure. The use of different diffusion rates for the channel and top cap impurities permits the adjustment of channel thickness in the finished structure by a final heat treatment process.

BRIEF DESCRIPTION OF THE DRAWING

FIGS. 1 through 11 show the cross section of a fragment of an IC wafer in the various stages of device processing.

FIG. 12 is a partial front elevation, cross section of the wafer fragment of FIGS. 1 through 11 showing device topography. Oxide and metallization have been omitted to better show the devices. The electrode connections are shown schematically.

DESCRIPTION OF THE INVENTION

In the drawing to be described below it is to be understood that a fragment of an IC wafer is portrayed in various processing stages. The drawing is not to scale but is exaggerated to illustrate the device structure.

FIG. 1 shows the starting wafer which is a silicon substrate 10 of a resistivity of about 5 ohm centimeters. It has a surface oxide 11 which is typically grown to about 0.5 micron thickness. Region 12 will be processed to contain an N-channel IGFET, region 13 a P-channel IGFET, and region 14 an N-channel JFET.

As shown in FIG. 2, the oxide thickness in regions 12 and 14 is reduced. This can be done by photolithographically etching the oxide away completely in holes 15 and 16 and then regrowing a thin oxide at 17 and 18. Alternatively the oxide can be etched down to the desired thickness. The former procedure is preferred because it permits relatively precise control over the thickness of oxides 17 and 18. The thin oxides will be relatively transparent to the subsequent boron implants while the thick oxide will mask them.

First a photoresist mask 19 is applied over region 14 and the wafer is subjected to a first boron ion 22 implant. A dosage of $3 \times 10^{12}$ ions per square centimeter can be applied at a potential of about 70 kev. At this energy the boron ions will penetrate oxide 17 to create a boron doped region 20. The thick oxide 11 and mask 19 will resist ion penetration elsewhere.

Then as shown in FIG. 3 mask 19 is stripped away and the wafer subjected to a second boron ion $22^1$ implant. Again a 70 kev energy is used so that the thin oxide 18 will be penetrated to create implanted region 21. The dosage is $3 \times 10^{12}$ atoms per square centimeter. During this implant region 20' will be additionally dosed over what was implanted during the first boron implant. The cumulative boron dosage in region 12 will be $6 \times 10^{12}$ ions per square centimeter.

The independent dosing of regions 12 and 14 permit separately optimizing the devices that will be subsequently fabricated in those regions.

As shown in FIG. 4 the wafer is heat treated in an oxidizing atmosphere as is characteristic of diffusion drive-in stop. Region 20' will be diffused to become p-well 23 and region 21 will be diffused to become p-well 24. At the same time, thin oxides 17 and 18 will be regrown to become oxides 25 and 26. Typically p-wells 23 and 24 will be about six microns deep while the oxides at 25 and 26 will grow to about one half micron.

Next the JFET channel is created. As shown in FIG. 5, a hole 28 is created in oxide layer 26, and arsenic ions 29 are implanted at 190 kev. The total dose is set at $1.5 \times 10^{13}$ atoms per square centimeter to create an arsenic rich region 30. Then the arsenic is diffused in an oxygen-rich atmosphere to produce the FIG. 6 structure. The diffusion time and temperature act to produce an N type channel 31 about 0.3 micron deep with an overlying oxide 32 regrown to about 0.6 micron thick. Since arsenic is a slow diffuser in silicon, particularly when compared to boron, channel region 31 is almost totally controlled physically in this diffusion step.

It is to be understood that diffusions 23 and 24 are shown in FIG. 4 at their final locations which will develop to some degree during subsequent heat treatments. Actually, after the first diffusion, as illustrated in FIG. 4, the penetration will be somewhat less than is shown. Also it is to be understood that original oxide 11 will grow slightly thicker as oxides 25 and 26 are formed. In order to avoid confusion in the subsequent drawing the oxide thicknesses are shown idealized and the various growth steps are not detailed. At the same time, the wafer surface flatness shown is idealized to avoid undue drawing complexity. The wafer surface topography illustrated does not reflect the etching that normally accompanies oxide regrowth.

In the next step the conventional CMOS process is continued in the P+ contact establishment. Channel stops, p-channel source and drain electrodes and JFET gate contacts are created. As shown in FIG. 7 a series of holes are photolithographically cut into the oxide shown schematically as 11. The holes labeled 33 are a ring cut in registry with the periphery of p-well 23. Holes 34 are a ring cut in registry with the periphery of p-well 24. Holes 35 and 36 will form a p-channel IGFET. Then a conventional boron predep and diffusion creates a series of P+ regions as shown in FIG. 8. In this operation the oxide is regrown inside the cuts of FIG. 7. Ring 37 makes an ohmic contact to p-well 23 and acts as a surface channel stop around the p-well. Ring 38 does the same for p-well 24. Regions 39 and 40 form the spaced apart source and drain electrodes for a p channel IGFET.

Then as shown in FIG. 9 another set of photolithographically produced oxide cuts are created. Cuts 41 form a ring around electrodes 39 and 40 to form a channel stop around the N channel IGFET. Cuts 42–45 will be used to form N channel source and drain electrodes. As shown in FIG. 10 a conventional phosphorous predeposition and diffusion is employed to form the N+ regions and to regrow the oxide in the cuts shown in FIG. 9. Region 46 forms the ring shaped channel stop while regions 47–50 form source and drain electroes.

As shown in FIG. 11, which illustrates only the N channel JFET in region 14, the oxide is provided with an area of reduced thickness 52. The oxide here is made about 0.44 micron thick. Then, as shown, the third boron ion implant is operated typically at about 140 kev energy. For this energy and oxide thickness only a very shallow top cap 53 is implanted. The dosage, typically, is about $3 \times 10^{13}$ atoms per square centimeter which creates an opposite conductivity type top cap 53 of substantially higher conductivity than channel 31. The doping density in the top cap still low enough to give JFET 10 the desired gate diode breakdown voltage. The most important characteristic is the careful control of impurity quantity which affords a good control of the electrical properties of the resulting device.

FIG. 12 is a partial front elevation cross section of a semiconductir wafer fragment showing the completed devices. The oxide and metallization layers along with typical passivation have been omitted so that the devices can be clearly seen. The connections to the device electrodes are shown schematically.

It can be seen that top cap 53 overlaps the channel 31 of the JFET. This parallel connects top cap 53 to diffusion 24 which acts as the gate electrode. Ring 38 provides a low resistance ohmic contact to the gate. If desired, top cap 53 can be further extended to slightly overlap gate contact 38. The top cap structure described can be made very thin yet can be used to bury the channel below the semiconductor surface. Since all of the JFET active region, the channel, is subsurface the noise normally associated with field effect devices is greatly reduced. The resulting JFET devices have very low noise figures and function as low noise amplifiers. If desired the heavy top gate structure of U.S. Pat. No. 4,176,368 can be incorporated into the devices to further improve performance.

While not shown a thin oxide with an overlying metal gate will exist on the spaces between electrodes 47–48 and 39–40. Ordinarily these will be created using a well-known automatic alignment process for CMOS device fabrication.

As described above channel 31 is created using a slow diffusion inpurity, such as arsenic, and top cap 53 is created using a relatively faster diffusing impurity such as boron. This arrangement permits the adjustment of final channel thickness as a last process step. Once the devices have been fabricated as shown in the drawing the conventional metallization contact mask is employed to remove the oxide where contacts are to be made. Then the devices are probed and the JFET pinch off ($V_p$)voltage measured. Depending upon the $V_p$ measured the wafer is heated for a time and temperature that will cause top cap 53 to penetrate into channel 31 thereby reducing the channel thickness (and $V_p$) to a desired value. Thus the total process produces a JFET with a controlled $V_p$.

In overall CMOS process terms the wafer is then subjected to conventional gate region implants to adjust IGFET device thresholds, $V_T$, the gate oxides grown to the desired thickness, and a final anneal cycle employed. Then the contact regions are opened up in a final contact etch and the wafer metallized. For example the wafer can be covered with about one micron of aluminum-silicon alloy. Then, using the final metallization etch mask, the matal is photolithographically etched to create the desired metallization pattern. The wafer is then subjected to a contact alloy cycle and coated with a passivation layer. Finally, the IC pads are contacted through the passivation layer. The wafer is then ready for separation into the individual IC dice and final assembly into suitable housings.

The above description shows how the conventional CMOS process can be modified slightly so that an N channel JFET can be built into the structure. Numerous alternatives are available. For example the first and second boron implant steps (FIGS. 2 and 3) can be replaced with aluminum implants. In this case the process times and temperatures would be adjusted to account for the higher diffusion rate of aluminum in silicon.

While the above process creates metal gate IGFET devices, the silicon gate process could easily be employed using either a single or multi polysilicon layer process. In this case the polysilicon layer is typically made conductive during the JFET top cap gate implant step.

The foregoing process is employed to create an N channel JFET. However, if desied, a P channel device could be created using suitable modifications. Typically all of the conductivity types, that are described above, will be complemented. For example a P type channel could be created in an N type well by implanting boron at 190 kev, through a suitably thin oxide, to a level of about $1 \times 10^{12}$ atoms per square centimeter. Then an N type top cap can be created by implanting phosphorous at 25 kev to a level of about $2.3 \times 10^{12}$ atoms per square centimeter.

A basic process for creating compatible JFET devices in a CMOS environment has been disclosed along with several alternatives. There are clearly other alternatives and equivalents, that are within the spirit and intent of the invention, that will occur to a person skilled in the art upon reading the foregoing. Accordingly it is intended that the scope of the invention be limited only by the following claims.

We claim:

1. In a CMOS integrated circuit wafer treatment process, the additional steps for creating a JFET comprising:

starting with a semiconductor wafer of a first conductivity type;

establishing an opposite conductivity type well in said wafer with said well having a resistivity suitable for a JFET gate;

creating spaced apart source and drain regions of said first conductivity type in said well;

creating a channel region having said first conductivity type joining said source and drain regions;

ion implanting an impurity of said opposite conductivity type having a different diffusity rate from the impurity in said channel to form an overlapping top cap over said channel to locate said channel below the surface of said wafer and whereby said top cap is connected to said well; applying operating potentials to said JFET;

measuring the pinch off voltage of said JFET channel; and heat treating said wafer to shift said pinch off voltage.

2. The process of claim 1 wherein said channel region impurity is a slower diffuser than said top cap impurity whereby said heat treating lowers said pinch off voltage.

3. The process of claim 2 wherein said channel region impurity is arsenic and said top cap impurity is boron.

4. The process of claim 2 wherein said well is established during conventional CMOS well formation.

5. The process of claim 4 wherein said well is more lightly doped than said conventional CMOS well.

6. The process of claim 5 wherein said well is doped with ion implanted boron deposited in an amount selected for desired well resistivity following said wafer processing.

7. The process of claim 5 wherein said well is doped with ion implanted aluminum deposited in an amount selected for the desired well resistivity following said wafer processing.

8. The process of claim 6 or 7 wherein said ion implantation is achieved through an oxide layer of suitable thickness on the surface of said wafer.

* * * * *